United States Patent
Chen et al.

(10) Patent No.: US 6,310,523 B1
(45) Date of Patent: Oct. 30, 2001

(54) WIDE-RANGE AND LOW-POWER CONSUMPTION VOLTAGE-CONTROLLED OSCILLATOR

(75) Inventors: Oscal Tzyh-Chiang Chen, Taipei Hsien; Robin Ruey-Bin Sheen, Yunling Hsien, both of (TW)

(73) Assignee: National Science Council, Taipei (TW)

( * ) Notice: Subject to any disclaimer, the term of this patent is extended or adjusted under 35 U.S.C. 154(b) by 0 days.

(21) Appl. No.: 09/566,454

(22) Filed: May 8, 2000

(51) Int. Cl.[7] ................................ H03B 5/02; H03K 3/03
(52) U.S. Cl. .................. 331/57; 331/108 A; 331/177 R; 331/179
(58) Field of Search .................... 331/57, 108 A, 331/177 R, 179

(56) References Cited

U.S. PATENT DOCUMENTS 5,389,898 * 2/1995 Taketoshi et al. ................. 331/57
5,475,344 * 12/1995 Maneatis et al. .................. 331/57
6,104,253 * 8/2000 Hall et al. ......................... 331/57

* cited by examiner

Primary Examiner—Siegfried H. Grimm
(74) Attorney, Agent, or Firm—Jiawei Huang; J. C. Patents

(57) ABSTRACT

A wide-range and low power consumption voltage-controlled oscillator according to the invention includes a logic control circuit, a parallel series controllable inverter bank and a voltage control load. The logic control circuit consists of a plurality of logic gates for receiving a selecting signal from an external device and then transmitting a control signal. The parallel series controllable inverter bank consists of a plurality of series controllable inverter banks electrically connected in parallel for receiving the control signal and outputting an oscillation signal, wherein the control signal is used to control the number of the series controllable inverter banks electrically connected in parallel. The voltage control load is electrically connected between the parallel series controllable inverter bank and ground for serving as a load of the parallel series controllable inverter bank.

12 Claims, 5 Drawing Sheets

Table 1

| S1 | S0 | Control_p1 | Control_p2 | Control_p3 | Control_p4 |
|----|----|-----------|-----------|-----------|-----------|
| 0  | 0  | 0         | 1         | 1         | 1         |
| 0  | 1  | 0         | 0         | 1         | 1         |
| 1  | 0  | 0         | 0         | 0         | 1         |
| 1  | 1  | 0         | 0         | 0         | 0         |

| S1 | S0 | Control_n1 | Control_n2 | Control_n3 | Control_n4 |
|----|----|-----------|-----------|-----------|-----------|
| 0  | 0  | 1         | 0         | 0         | 0         |
| 0  | 1  | 1         | 1         | 0         | 0         |
| 1  | 0  | 1         | 1         | 1         | 0         |
| 1  | 1  | 1         | 1         | 1         | 1         |

WIDE-RANGE AND LOW-POWER CONSUMPTION VOLTAGE-CONTROLLED OSCILLATOR

BACKGROUND OF THE INVENTION

1. Field of the Invention

The invention relates to a wide-range voltage-controlled oscillator, and in particular to a wide-range and low-power consumption voltage-controlled oscillator applied in digital circuits and communication systems with high efficiency and low power consumption.

2. Description of the Related Art

Regardless of whether used in digital circuits or communication systems, a voltage-controlled oscillator plays a key role. In a digital circuit, the voltage-controlled oscillator is used to provide a required clock signal; and in a communication system, the voltage-controlled oscillator can provide an oscillation frequency for serving as a carrier wave or for use of a local oscillator when modulating. Meanwhile, the voltage-controlled oscillator is also a key device for both phase-locked circuits and frequency synthesizers.

In general, an oscillator is formed by an LC charge/discharge circuit. An oscillation frequency is generated by the LC charge/discharge circuit for use of above-stated circuits. Recently, since the integrity of ICs has made great progress, inductors used for ICs are no longer suitable for use in ICs manufacture.

For a better stability of an output frequency from an oscillator of a chip, a ring oscillator is usually adopted because it is hard to control the properties of inductors and the inductors use extra area.

FIG. 1 shows a conventional wide-range phase-locked loop. Reference symbol $f_{ref}$ represents a reference frequency, $f_{out}$ represents an output frequency, $S_o$ and $S_1$ represent selecting signals, $V_c$ represents a control voltage. The reference frequency $f_{ref}$ is transmitted from an external circuit (not shown) to a phase detector 100. The reference frequency $f_{ref}$ is converted into the control voltage $V_c$ after passing through a charge pump 102 and a loop filter 104. The control voltage Vc and the selecting signals $S_0$ and $S_1$ together are inputted to a wide-range voltage-controlled oscillator 106. At this time, the wide-range voltage controlled oscillator 106 outputs the output frequency $f_{out}$ to a required circuit (not shown). Furthermore, a divider 108 receives the output frequency $f_{out}$ coming from the wide-range voltage-controlled oscillator 106 and then outputs a corresponding frequency by dividing the output frequency $f_{out}$ with a certain multiple. Using the phase detector 100, the corresponding frequency is compared to the reference frequency $f_{ref}$ thereby to determine whether the output frequency $f_{out}$ is a required frequency.

FIG. 2 shows a ring voltage-controlled oscillator 200, having an odd number of inverters 202 electrically connected in series. That is, the output terminal of each inverter 202 is electrically connected to the input terminal of its next inverter 220, and the like, and the output terminal of a last inverter 202 is electrically connected to the input terminal of a first inverter, thereby forming a closed loop. With a time delay caused by each inverter 202, an oscillation frequency can be generated. The period of the oscillation frequency is dependent on the entire time delay of the inverters 202.

Moreover, there is a voltage control load electrically connected between the output terminal of each inverter 202 and ground. The voltage control load consists of a voltage control resistor VCR204 and a capacitor C206 electrically connected in series. By adjusting the control voltage $V_c$ on the voltage control resistor VCR204, the charge/discharge time between two adjacent inverters 202 can be changed thereby to control the oscillation frequency. The time delay can be approximately equal to a RC time constant, wherein the C is the capacitance of the capacitor C206 and R is an equivalent resistance of the voltage control resistor VCR204. The equivalent resistance is dependent on the sizes of transistors inside the inverters 202.

The period of the output oscillation frequency is positively proportional to the RC time constant. In other words, the oscillation frequency is inversely proportional to the RC time constant. Therefore, the power consumption of the ring voltage-controlled oscillator 200 can be expressed by:

$$P=C*V^2*f$$

Wherein, C is the capacitance of the capacitor C206, V is a power supply voltage and f is an oscillation frequency. If the oscillation frequency f is replaced with the RC time constant, the power consumption can be obtained by:

$$P=K_p*(C*V^2)*(1/RC)=K_p*V^2/R$$

Wherein, $K_p$ is a constant, representing the number of the inverters 202. It can be known from the above-stated equation that the power consumption of the ring voltage-controlled oscillator 200 is a constant once the sizes of transistors is decided, and is independent of the oscillation frequency.

Generally, to increase the range of the output frequency of the oscillator, the ring oscillator must generate and transmit a high-frequency clock signal to a frequency synthesizer, and in response to the high-frequency clock, the frequency synthesizer can generate a clock having various frequencies. Furthermore, the wide range of output frequency can also be obtained by increasing the number of the inverters. However, Increasing the number of the inverters results in more power consumption.

As to the stability of the output frequency, the oscillation frequency of the ring oscillator is adjusted during time change in a transient region. Therefore, the ring oscillator will be easily affected by noises and temperatures, resulting in a poor stability on the output signal.

SUMMARY OF THE INVENTION

In view of the above, the invention provides a wide-range and low power consumption voltage-controlled oscillator which includes a plurality of series controllable inverter banks electrically connected in parallel, voltage control resistors, capacitors and a control unit. Under the same output load, the control unit is used to select the number of the series controllable inverter banks electrically connected in parallel for adjusting the driving ability thereof.

A wide-range and low power consumption voltage-controlled oscillator according to the invention includes a logic control circuit, a parallel series controllable inverter bank and a voltage control load. The logic control circuit consists of a plurality of logic gates for receiving a selecting signal from an external device and then transmitting a control signal. The parallel series controllable inverter bank consists of a plurality of series controllable inverter banks electrically connected in parallel for receiving the control signal and outputting an oscillation signal, wherein the control signal is used to control the number of the series controllable inverter banks electrically connected in parallel. The voltage control load is electrically connected between the parallel series controllable inverter bank and ground for serving as a load of the parallel series controllable inverter bank.

Each series controllable inverter bank consists of output terminal switch controllable inverters. Each output terminal switch controllable inverter includes a PMOS transistor, an NMOS transistor, an inverted logic switch and a non-inverted logic switch, wherein the drain of the PMOS transistor is electrically connected to a power supply while the drain of the NMOS transistor is electrically connected to ground, and the inverted logic switch and the non-inverted logic switch are electrically connected between the PMOS transistor and the NMOS transistor.

Furthermore, each series controllable inverter bank consists of power supply switch controllable inverters. Each power supply switch controllable inverter includes a PMOS transistor, an NMOS transistor, an inverted logic switch and a non-inverted logic switch, wherein one terminal of the inverted logic switch is electrically connected to a power supply while one terminal of the non-inverted logic switch is electrically connected to ground, and the PMOS transistor and the NMOS transistor are electrically connected between the inverted logic switch and the non-inverted logic switch.

BRIEF DESCRIPTION OF THE DRAWINGS

The invention will become more fully understood from the detailed description given hereinafter and the accompanying drawings which are given by way of illustration only, and thus do not limit the present invention, and wherein.

DETAILED DESCRIPTION OF THE PREFERRED EMBODIMENTS

Figure 3:
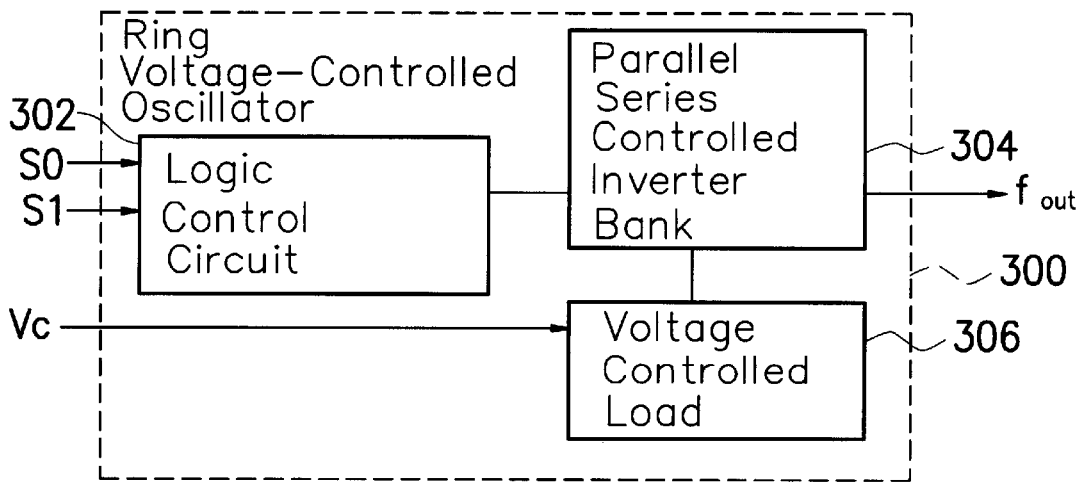
FIG. 3 shows a block circuit diagram of a wide-range and low power consumption voltage-controlled oscillator according to the invention.

FIG. 3 shows a block circuit diagram of a wide-range and low power consumption voltage-controlled oscillator 300 according to the invention. An external control device (not shown) inputs two selecting signals $S_0$ and $S_1$ to a logic control circuit 302 of the voltage-controlled oscillator 300. The logic control circuit 302 consists of a number of logic gates. After receiving the selecting signals $S_0$ and $S_1$, a logic operation is performed to obtain a set of logic control signals by the logic control circuit 302. The control signals are sent to a parallel series controllable inverter bank 304 from the output terminal of the logic control circuit 302.

In the parallel series controllable inverter bank 304, a plurality of controllable inverters (not shown) are electrically connected in series to form a plurality of loop-closed series controllable inverter banks, and then the loop-closed series controllable inverter banks are electrically connected in parallel. When the input terminals of the parallel series controllable inverter bank 304 receive the control signals output from the logic control circuit 302, a required output oscillation frequency $f_{out}$ is output from the output terminal of the parallel series controllable inverter bank 304 by controlling the number of the series controllable inverter banks connected in parallel.

Figure 1:
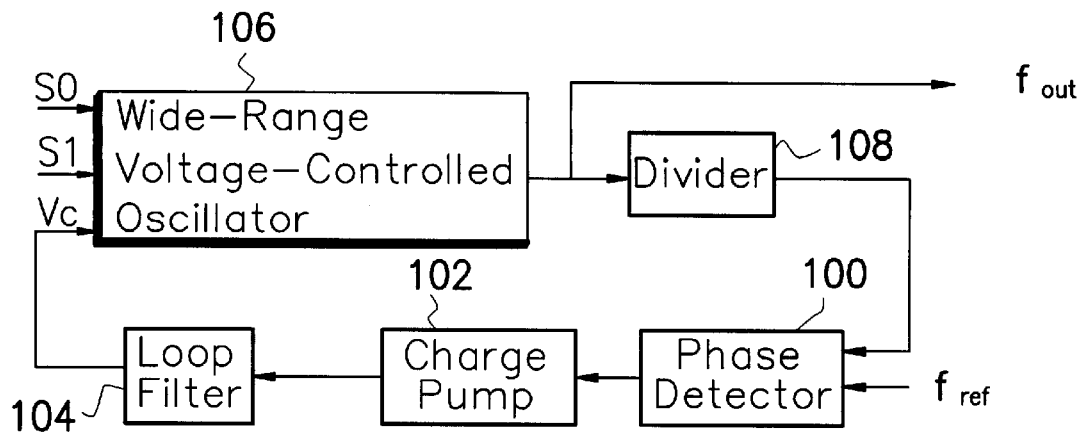
FIG. 1 is a block circuit diagram of a wide-range phase-locked loop according to the prior art.
Figure 2:
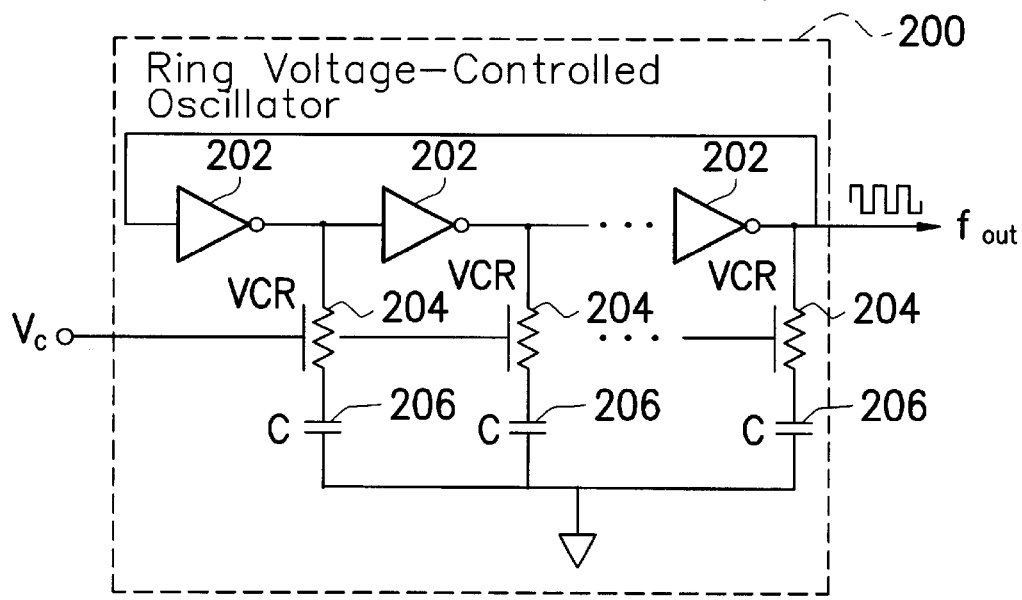
FIG. 2 is a circuit diagram of a ring voltage-controlled oscillator according to the prior art.

Moreover, a voltage control load 306 is electrically connected to the parallel series controllable inverter bank 304 to serve as the load thereof. A control voltage $V_c$ is inputted to the voltage control load 306 from a loop filter like that shown in FIG. 1. By controlling the control voltage $V_c$, an oscillation frequency $f_{out}$ output from the parallel series controllable inverter bank 306 can be adjusted.

Figure 4:
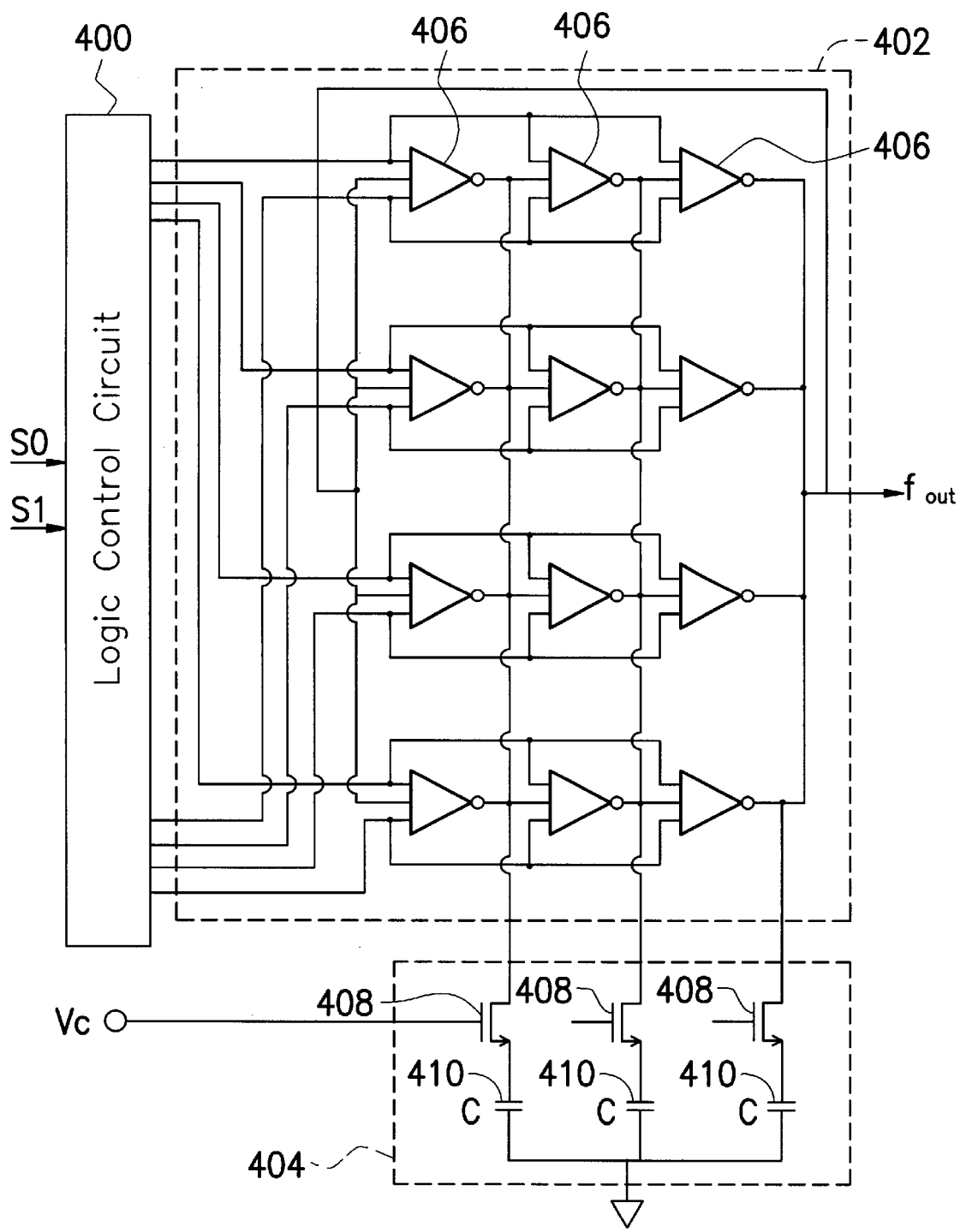
FIG. 4 is a circuit diagram of a wide-range and low-power consumption voltage-controlled oscillator according to the invention.

FIG. 4 is a circuit diagram showing a wide-range and low-power consumption voltage-controlled oscillator 412 according to a preferred embodiment of the invention. In the preferred embodiment, a parallel series controllable inverter bank 402 has four series controllable inverter banks each consisting of three controllable inverters 406. The three controllable inverters 406 are electrically connected in series, and the four controllable inverter banks are electrically connected in parallel. The output terminal of the parallel series controllable inverter bank 402 outputs an oscillation frequency $f_{out}$.

A logic control circuit 400 receives two selecting signals $S_0$ and $S_1$. After performing a logic operation, 4 pairs of control signals are outputted to control the parallel series controllable inverter bank 402. By changing the number of series controllable inverter banks electrically connected in parallel, a different output frequency range can be obtained.

There are three sets of voltage control loads 404 electrically connected between the output terminals of the three inverters 406 of each series controllable inverter bank and ground, respectively, as shown in FIG. 4. Each voltage control load 404 includes a transistor 408 serving a voltage control resistor and a capacitor 410 serving as a load capacitor. By adjusting a control voltage $V_c$ input to the gate of the transistor 408, the oscillation frequency $f_{out}$ output from the parallel series controllable inverter bank 402 can controlled.

Compared to the prior ring voltage-controlled oscillator having the same area of IC, a number of series voltage controlled inverter banks formed by the inverters 406 are electrically connected in parallel. The logic control circuit 400 is used to control the number of series voltage controlled inverter banks electrically connected in parallel thereby to select an output frequency range for the wide-range voltage-controlled oscillator 412.

The sum of the areas occupied by transistors of all controllable inverters 406 in the parallel series controllable inverter bank 402 is the same as that in the prior ring voltage-controlled oscillator. In other words, the equivalent resistance of the controllable inverter 406 is 4 times that of the prior inverter. With the same load capacitance, the driving ability on each output terminal of the parallel series controllable inverter bank 402 can be well controlled by just adjusting the number of the series controllable inverter banks electrically connected in parallel. By changing the charge/discharge time constant, the output oscillation frequency $f_{out}$ can be adjusted.

When an oscillation signal in a higher frequency range is needed, four series controllable inverter banks are electrically connected in parallel. At this time, the driving ability of the parallel series controllable inverter bank 402 is equal to that of all inverters 406, and that of the prior ring inverters. Moreover, the wide-range voltage-controlled oscillator 412 can generate a higher frequency oscillation signal. Inversely, when a lower frequency oscillation signal is needed, the charge/discharge time constant is increased, the oscillation frequency generated by the wide-range voltage-controlled oscillator 412 and the driving ability of the parallel series controllable inverter bank 402 are reduced, by just reducing the number of the series controllable inverter banks electrically connected in parallel.

Figure 5A:
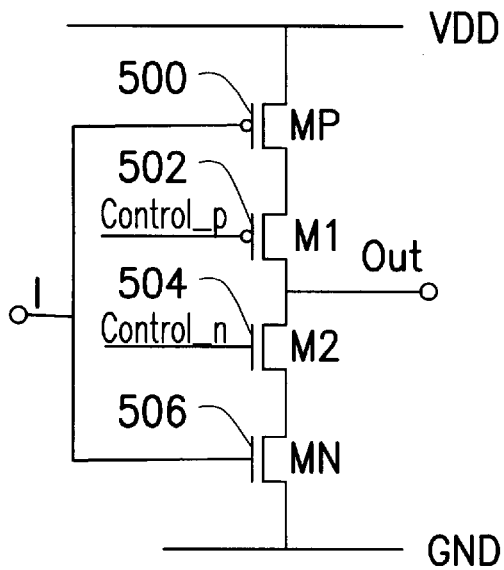
FIG. 5A is a circuit diagram of an output terminal switch controllable inverter according to the invention.

FIG. 5A shows a circuit diagram of an output terminal switch controllable inverter according to the invention. The output terminal switch controllable inverter includes a PMOS transistor 500, an NMOS transistor 506, a PMOS control transistor 502 and an NMOS control transistor 504.

As shown in FIG. 5A, the drain of the PMOS transistor 500 is electrically connected to a power supply $V_{DD}$ while the drain of the NMOS transistor 506 is electrically connected to ground. Moreover, the PMOS control transistor 502 and the NMOS control transistor 504 are electrically connected between the PMOS transistor 500 and the NMOS transistor 506 in series. Control_p and Control_n signals are used to control the PMOS control transistor 502 and the NMOS control transistor 504 on/off. When the control signal Control_p is at a low logic level and the control signal Control_n is at a high logic level both control transistors 502 and 504 are turned on and then the inverter performs a charge/discharge operation on the next circuit. When the control signal Control_p is at a high logic level and the control signal Control_n is at a low logic level, both control transistors 502 and 502 are turned off, and then the output terminal of the inverter is at a floating state. At this time, the inverter is not operated.

Figure 5B:
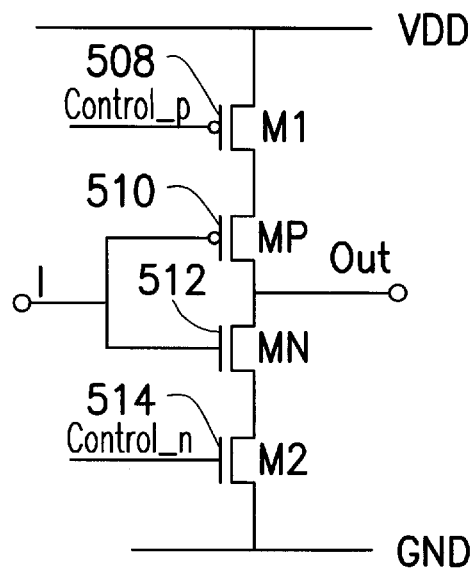
FIG. 5B is a circuit diagram of a power supply switch controllable inverter according to the invention.

FIG. 5B shows a circuit diagram of a power supply switch controllable inverter according to the invention. The power supply switch controllable inverter includes a PMOS transistor 510, an NMOS transistor 512, a PMOS control transistor 508 and an NMOS control transistor 514. The drain of the PMOS control transistor 508 is electrically connected to a power supply $V_{DD}$ while the source of the NMOS control transistor 514 is electrically connected to ground. The PMOS transistor 510 and the NMOS transistor 512 are electrically connected between the PMOS control transistor 508 and the NMOS control transistor 514 in series. Control_p and Control_n signals are used to control the PMOS control transistor 508 and the NMOS control transistor 514 on/off. When Control_p is at a low logic level and the Control_n is at a high logic level, control transistors 508 and 514 are turned on, and then the inverter performs a charge/discharge operation on the next circuit. Inversely, when the Control_n is at a high logic level and the Control_n is at a low logic level, the control transistors 508 and 514 are turned off, and the inverter has no power supplied. At this time, the inverter is not operated.

Figure 6:
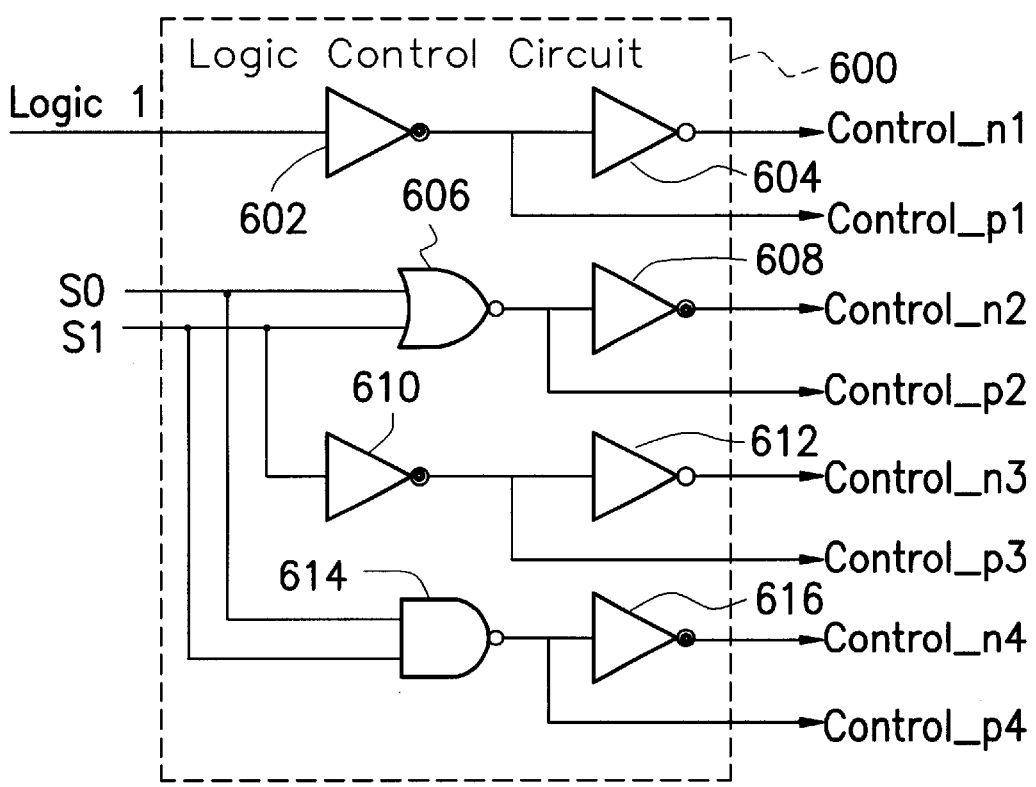
FIG. 6 is a circuit diagram of a logic control circuit according to the invention.

FIG. 6 shows a logic control circuit 600 according to the invention. A Logic 1 signal and two selecting signals $S_0$ and $S_1$ are used to select the number of series controllable inverter banks electrically connected in parallel, wherein the Logic 1 signal is coming from the power supply and is at a high logic level. The area occupied by the logic control circuit 600 consisting of inverters, inverted OR gates and inverted AND gates is less than 1% of that of the oscillator circuit. It has negligible power consumption at a steady state. Therefore, the logic control circuit 600 can not affect the entire voltage-controlled oscillator at all.

As shown in FIG. 6, the Logic 1 signal is operated by an inverter 602 to generate a Control_p1 signal and further by an inverter 604 to generate a Control_n1 signal. The selecting signals $S_0$ and $S_1$ are operated by an inverted OR gate 606 to generate a Control_p2 signal and further by an inverter 608 to generate a Control_n2 signal. Similarly, the selecting signals $S_0$ and $S_1$ are operated by an inverter 610 to generate a Control_p3 signal and further by an inverter 612 to generate a Control_n3 signal. The selecting signals $S_0$ and $S_1$ are operated by an inverted AND gate 614 to generate a Control_p4 signal and further by an inverter 616 to generate a Control_n4 signal.

Table 1 shows a Truth Table of the logic control circuit. In Table 1, when the input selecting signals $S_0$, $S_1$ are 00, 01, 10 and 11, the 4 pairs of control signals Control_n1, Control_n2, Control_n3 and Control_n4 are 1000, 1100, 1110 and 1111 and the 4 pairs of control signals Control_p1, Control_p2, Control are 0111, 0011, 0001 and 0000. The number of series controllable inverter banks electrically connected in parallel are 1, 2, 3 and 4.

Figure 7A:
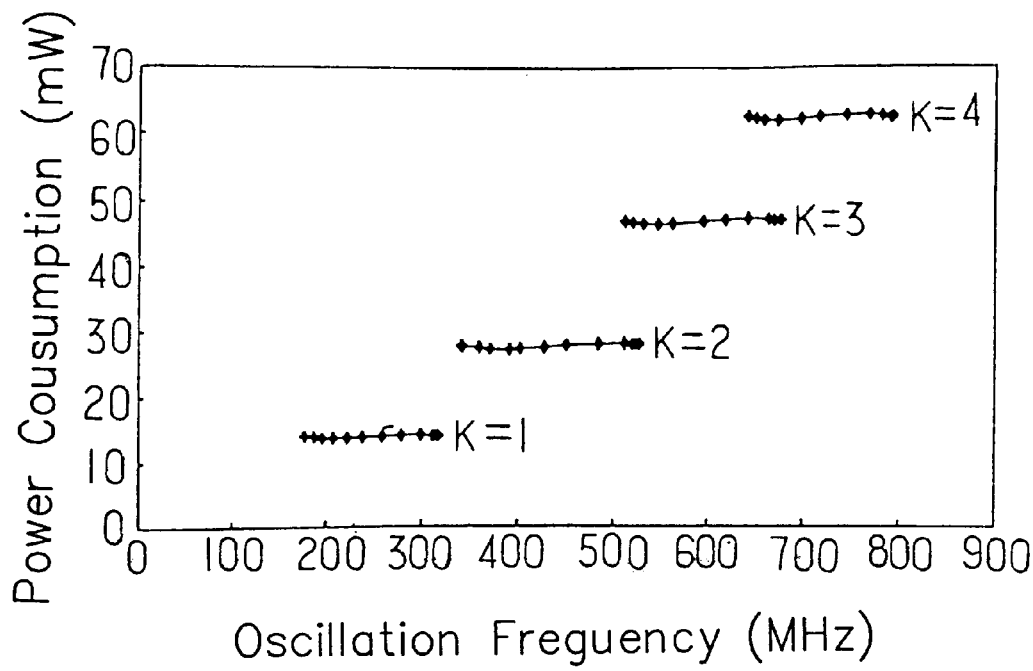
FIG. 7A is a graph showing a relationship between power consumption and oscillation frequency of a voltage-controlled oscillator having an output terminal switch controllable inverter structure according to the invention.

Using TSMC 0.6 $\mu$m 1P3M CMOS process, a wide-range voltage-controlled oscillator with an operating voltage 3.3V according to the invention can be manufactured. FIG. 7A shows a relationship between power consumption and oscillation frequency of the voltage-controlled oscillator having an output terminal switch controllable inverter structure as shown in FIG. 4, wherein the output frequency ranges from 178 MHz to 792 MHz, and K represents the number of the series controllable inverter banks electrically connected in parallel. As shown in FIG. 7A, the power consumption of the voltage-controlled oscillator is positively proportional to the number of the series controllable inverter banks electrically connected in parallel in the range of 13.6 MW to 62.6 mW.

Figure 7B:
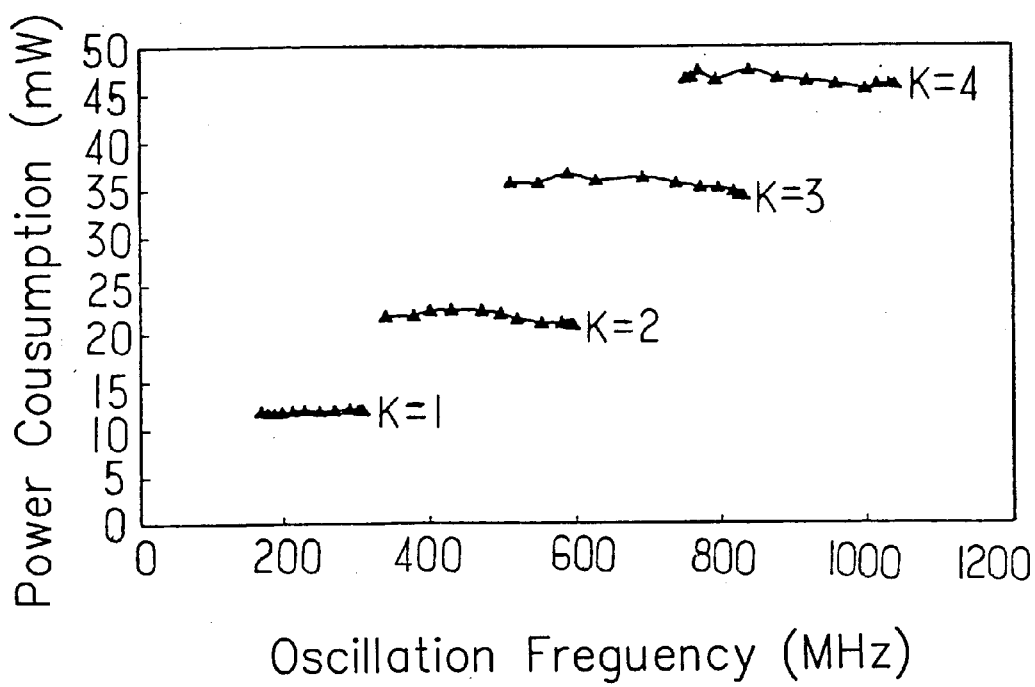
FIG. 7B is a graph showing a relationship between power consumption and oscillation frequency of a voltage-controlled oscillator having a power supply switch controllable inverter structure according to the invention; and Table 1 shows a truth table of the logic control circuit of FIG. 6.

FIG. 7B shows a relationship between power consumption and oscillation frequency of the voltage-controlled oscillator having a power supply switch controllable inverter structure as shown in FIG. 4, wherein the output frequency ranges from 184 MHz to 10.4 GHz, and K represents the number of the series controllable inverter banks electrically connected in parallel. It is obvious from FIG. 7B that the power consumption of the voltage-controlled oscillator is positively proportional to the number of the series controllable inverter banks electrically connected in parallel in the range of 11.7 MW~47.8 mW. Not only does this structure have advantages of wide-range and low power consumption, but impacts caused by additional control transistors on the output oscillation frequency are greatly reduced. As a result, the highest output oscillation frequency of the power supply switch controllable inverter structure is higher than that of the output terminal switch controllable inverter structure.

Accordingly, the invention applied in a phase-locked loop has the following advantages: a frequency range is first selected and then a required oscillation frequency is adjusted by a control voltage. The wide-range frequency output does not cause the ratio between the control voltage variation and the frequency variation to increase. Therefore, with the proposed wide-range and low power consumption voltage-controlled oscillator, a larger frequency variation can be generated by a larger enough control voltage change. As a result, the phase-locked loop can have a stable operation without phase noises and jitters.

Furthermore, under the same output load, the logic control circuit can be used to select the number of series controllable inverter banks electrically connected in parallel, to adjust the driving ability and the charge/discharge time constant of the inverter banks, thereby outputting a required oscillation frequency.

Moreover, without a frequency synthesizer or an increase in the number of inverters electrically connected in series, the output frequency range of the wide-range and low power consumption voltage-controlled oscillator can be effectively increased. Not only can complexity in circuit design be greatly reduced, but low power consumption of the voltage-controlled oscillator can be achieved.

While the invention has been described by way of example and in terms of the preferred embodiment, it is to be understood that the invention is not limited to the disclosed embodiments. On the contrary, it is intended to cover various modifications and similar arrangements as would be apparent to those skilled in the art. Therefore, the scope of the appended claims should be accorded the broadest interpretation so as to encompass all such modifications and similar arrangements.

What is claimed is:

1. A wide-range and low power consumption voltage-controlled oscillator, comprising:
    a logic control circuit consisting of a plurality of logic gates for receiving a selecting signal from an external device and then transmitting a control signal;
    a parallel series controllable inverter bank consisting of a plurality of series controllable inverter banks electrically connected in parallel for receiving the control signal and outputting an oscillation signal, wherein the control signal is used to control the number of the series controllable inverter banks electrically connected in parallel; and
    a voltage control load electrically connected between the parallel series controllable inverter bank and ground for serving as a load of the parallel series controllable inverter bank.

2. The oscillator as claimed in claim 1, wherein the logic gates includes inverters, inverted OR gates and inverted AND gates.

3. The oscillator as claimed in claim 1, wherein each series controllable inverter bank consists of odd number of controllable inverters.

4. The oscillator as claimed in claim 3, wherein the controllable inverters are output terminal switch controllable inverters or power supply switch controllable inverters.

5. The oscillator as claimed in claim 1, wherein the voltage control load includes a voltage control resister and a capacitor electrically connected in series.

6. The oscillator as claimed in claim 5, wherein the voltage control resistor is performed by a transistor with a control voltage.

7. A wide-range and low power consumption voltage-controlled oscillator comprising a parallel series controllable inverter bank consisting of a plurality of series controllable inverter banks electrically connected in parallel for receiving a control signal and outputting an oscillation signal, wherein the control signal is used to control the number of the series controllable inverter banks electrically connected in parallel, and each series controllable inverter bank consists of controllable inverters, wherein each controllable inverter is:
    an output terminal switch controllable inverter comprising a PMOS transistor, an NMOS transistor, an inverted logic switch and a non-inverted logic switch, wherein the drain of the PMOS transistor is electrically connected to a power supply while the drain of the NMOS transistor is electrically connected to ground, and the inverted logic switch and the non-inverted logic switch are electrically connected between the PMOS transistor and the NMOS transistor.

8. The wide-range and low power consumption voltage-controlled oscillator as claimed in claim 7, wherein the inverted logic switch is an inverted PMOS transistor, and the non-inverted logic switch is a non-inverted NMOS transistor.

9. The wide-range and low power consumption voltage-controlled oscillator as claimed in claim 7, wherein the PMOS transistor and the NMOS transistor can be performed by a CMOS transistor.

10. A wide-range and low power consumption voltage-controlled oscillator comprising a parallel series controllable inverter bank consisting of a plurality of series controllable inverter banks electrically connected in parallel for receiving a control signal and outputting an oscillation signal, wherein the control signal is used to control the number of the series controllable inverter banks electrically connected in parallel, and each series controllable inverter bank consists of controllable inverters, wherein each controllable inverter is:
    a power supply switch controllable inverter comprising of a PMOS transistor, an NMOS transistor, an inverted logic switch and a non-inverted logic switch, wherein one terminal of the inverted logic switch is electrically connected to a power supply while one terminal of the non-inverted logic switch is electrically connected to ground, and the PMOS transistor and the NMOS transistor are electrically connected between the inverted logic switch and the non-inverted logic switch.

11. The wide-range and low power consumption voltage-controlled oscillator as claimed in claim 10, wherein the inverted logic switch is an inverted PMOS transistor, and the non-inverted logic switch is a non-inverted NMOS transistor.

12. The wide-range and low power consumption voltage-controlled oscillator as claimed in claim 10, wherein the PMOS transistor and the NMOS transistor can be performed by a CMOS transistor.

* * * * *